United States Patent
Kumar et al.

(10) Patent No.: US 11,119,132 B2
(45) Date of Patent: Sep. 14, 2021

(54) METHOD AND SYSTEM FOR LOW SAMPLING RATE ELECTRICAL LOAD DISAGGREGATION

(71) Applicant: Tata Consultancy Services Limited, Mumbai (IN)

(72) Inventors: Kriti Kumar, Bangalore (IN); Mariswamy Girish Chandra, Bangalore (IN); Achanna Anil Kumar, Bangalore (IN); Naveen Kumar Thokala, Bangalore (IN)

(73) Assignee: Tata Consultancy Services Limited, Mumbai (IN)

( * ) Notice: Subject to any disclaimer, the term of this patent is extended or adjusted under 35 U.S.C. 154(b) by 4 days.

(21) Appl. No.: 16/813,794

(22) Filed: Mar. 10, 2020

(65) Prior Publication Data
US 2021/0011062 A1    Jan. 14, 2021

(30) Foreign Application Priority Data
Jun. 5, 2019 (IN) .............................. 201921022305

(51) Int. Cl.
*G01R 21/133* (2006.01)
*G06N 20/00* (2019.01)
*G06N 7/00* (2006.01)

(52) U.S. Cl.
CPC ........... *G01R 21/133* (2013.01); *G06N 7/005* (2013.01); *G06N 20/00* (2019.01)

(58) Field of Classification Search
CPC ....... G06N 20/00; G06N 7/005; G01R 21/133
See application file for complete search history.

(56) References Cited

U.S. PATENT DOCUMENTS

| 9,256,908 B2 | 2/2016 | Dai et al. | |
| 2012/0278272 A1* | 11/2012 | Kim | G06F 11/3013 |
| | | | 706/52 |

(Continued)

OTHER PUBLICATIONS

Kumar, K. et al. "An Intuitive Explanation of Graph Signal Processing-Based Electrical Load Disaggregation," *2017 IEEE 13th International Colloquium on Signal Processing & Its Applications (CSPA)*, Mar. 10-12, 2017, Penang, Malaysia; 7 pages.

(Continued)

*Primary Examiner* — Raymond L Nimox
(74) *Attorney, Agent, or Firm* — Finnegan, Henderson, Farabow, Garrett & Dunner LLP

(57) ABSTRACT

This disclosure relates generally to method and system for low sampling rate electrical load disaggregation. At low sampling rates, disaggregation of energy load is challenging due to unavailability of events and signatures of the constituent loads. The disclosed energy disaggregation technique receives aggregated load data from a utility meter and sequentially obtains training data for determining disaggregated energy load at low sampling rate. Dictionaries are used to characterize the different loads in terms of power values and time of operation. The obtained dictionary coefficients are treated as graph signals and graph smoothness is used for propagating the coefficients from the training phase to the test phase by formulating an optimization model. The derivation of the optimization model identifies the load of interest and estimate their power consumption based on optimization model constraints. This method achieves accuracy greater than 70% for the loads of interest at low sampling rates.

15 Claims, 6 Drawing Sheets

(56) References Cited

U.S. PATENT DOCUMENTS

| | | | | |
|---|---|---|---|---|
| 2012/0290230 A1* | 11/2012 | Berges Gonzalez | ................ | G05B 19/0428 |
| | | | | 702/61 |
| 2013/0103215 A1* | 4/2013 | Dai | ................ | G06Q 50/06 |
| | | | | 700/291 |
| 2013/0238266 A1* | 9/2013 | Savvides | ............. | H02J 13/0017 |
| | | | | 702/61 |
| 2017/0030949 A1* | 2/2017 | Yu | ................ | G01D 4/004 |

OTHER PUBLICATIONS

Gaur, M. et al. (2018). "Disaggregating Transform Learning for Non-Intrusive Load Monitoring," *IEEE Access*, vol. 6; pp. 46256-46265.

* cited by examiner

METHOD AND SYSTEM FOR LOW SAMPLING RATE ELECTRICAL LOAD DISAGGREGATION

PRIORITY CLAIM

The U.S. patent application claims priority under 35 U.S.C § 119 to Indian patent application no. (201921022305), filed on Jun. 5, 2019.

TECHNICAL FIELD

The disclosure herein generally relates to utility consumption, and, more particularly, to method and system for low sampling rate electrical load disaggregation.

BACKGROUND

In modern power systems, smart meter data analytics is crucial for various entities involved in energy management. Present power sector is witnessing demand-side deregulations across the world, coupled with the ongoing deployment of smart meters which provides energy consumption data at regular intervals. Electrical load disaggregation is one of the smart meter analytics techniques which provide information about the usage and consumption patterns of the individual loads using the aggregate power consumption measurements. It can be leveraged for a variety of functionalities and value additions in the emerging smart grid scenario. Many existing and emerging smart meters provide low granular aggregate power measurements at 15- or 30-minutes intervals. However, for these low sampling rates, disaggregation of loads is tedious due to unavailability of events and signatures of the constituent loads. Hence, there is a necessity for a technique to analyze this low sampled aggregated power data to provide valuable inputs and insights for different entities in the ecosystem like, consumers, aggregators, retailers and utilities.

While disaggregation of loads using high power sampled data is studied extensively in literature, limited results are available for the low sampled case. Most of the recent methods for low sampled power data utilize the emerging concepts of Graph Signal Processing (GSP) for load disaggregation. One method is based on greedily solving the graph smoothness term for load identification from 1-minute sampled aggregate power data. Although the detection accuracy is good, the consumption estimates are poor as they are merely the average consumption of the load. Another method uses graph signal smoothness-based label propagation for load identification and actual power consumption estimation for 15 minutes aggregate power data. Both these methods use the assumption that the load signals are smooth with respect to the graph created using aggregate power measurements to carry out load disaggregation. Another method on the similar lines, utilizes matrix factorization and graph shift quadratic form constraint to carry out load disaggregation. However, this method estimates the individual load signals as piece-wise constant values instead of real values. Thus, conventional techniques lack determining disaggregated energy loads at low sampling frequency.

SUMMARY

Embodiments of the present disclosure present technological improvements as solutions to one or more of the above-mentioned technical problems recognized by the inventors in conventional systems. For example, in one embodiment, a system for is provided. The system includes a processor, an Input/output (I/O) interface and a memory coupled to the processor is capable of executing programmed instructions stored in the processor in the memory to pre-process to receive a aggregated load data ($\overline{X}_{test}$) obtained from a utility meter among a plurality of utility meters at a plurality of regular time intervals. The aggregated load data comprises total energy consumed by a plurality of electrical loads connected to the corresponding utility meter and base loads which are low power loads. The system further receives a training data ($\overline{X}_{train}$), wherein the training data is generated from the plurality of utility meters. The aggregate load data ($\overline{X}_{test}$) and the training data ($\overline{X}_{train}$) is represented as a matrix, where a column vector represents the plurality of regular time intervals covered in a predefined time period and a row vector represents a total number of predefined time periods considered. Further, a disaggregated energy load at low sampling rate for the aggregated load data ($\overline{X}_{test}$) of each utility meter is determined using an energy disaggregation technique. This technique comprises obtaining, a total load consumption ($X$) using the aggregated load data ($\overline{X}_{test}$) and the training data ($\overline{X}_{train}$). Further, a laplacian graph ($L_m$) is constructed for each electrical load ($m$) using the total load consumption ($X$). Further, an optimization model is generated for estimating the dictionary coefficient ($Z_m$) of each electrical loads ($m$). The dictionary coefficient (($Z_m^{test}$) of each electrical loads ($m$) is estimated using the laplacian graph ($L_m$), a dictionary ($D_m$) and a dictionary co-efficient ($Z_m^{train}$), wherein, the dictionary ($D_m$) and the dictionary co-efficient ($Z_m^{train}$) are obtained corresponding to the electrical load ($m$) using a pre-trained dictionary. The dictionary is pre-trained using the dictionary learning for every load using the load specific consumption ($X_m$) corresponding to the electrical load ($m$). The load consumption ($\widehat{X_m}$) for each electrical load ($m$) among the plurality of electrical loads ($M$) is estimated using the estimated energy coefficient ($Z_m^{test}$) with the corresponding dictionary ($D_m$). The system iteratively, performs for each electrical load ($m+1$) among the plurality of electrical loads ($M$) by, re-computing, a new aggregated load data ($\overline{X}_{test}$) by subtracting the estimated load energy consumption ($\widehat{X_m}$) from the previous load consumption ($\overline{X}_{test}$) value and re-computing, the new total load consumption ($X$) by subtracting the estimated load energy consumption ($\widehat{X_m}$) and the load specific consumption ($X_m$) from the previous total load consumption ($X$).

In another aspect, provides a method that includes a processor, an Input/output (I/O) interface and a memory coupled to the processor is capable of executing programmed instructions stored in the processor in the memory to pre-process receive a aggregated load data ($\overline{X}_{test}$) obtained from a utility meter among a plurality of utility meters at a plurality of regular time intervals. The aggregated load data comprises total energy consumed by a plurality of electrical loads connected to the corresponding utility meter and base loads which are low power loads. The method further receives a training data ($\overline{X}_{train}$), wherein the training data is generated from the plurality of utility meters. The aggregate load data ($\overline{X}_{test}$) and the training data ($\overline{X}_{train}$) is represented as a matrix, where a column vector represents the plurality of regular time intervals covered in a predefined time period and a row vector represents a total number of predefined time periods considered. Further, a disaggregated energy load at low sampling rate for the aggregated load data ($\overline{X}_{test}$) of each utility meter is determined using an energy disaggregation technique. This technique comprises obtaining, a total load consumption (X) using the aggregated load data ($\overline{X}_{test}$) and the training data ($\overline{X}_{train}$). Further, a laplacian graph ($L_m$) is constructed for each electrical load (m) using the total load consumption (X). Further, an optimization model is generated for estimating the dictionary coefficient ($Z_m$) of each electrical loads (m). The dictionary coefficient ($Z_m^{test}$) of each electrical loads (m) is estimated using the laplacian graph ($L_m$), a dictionary ($D_m$) and a dictionary co-efficient ($Z_m^{train}$), wherein, the dictionary ($D_m$) and the dictionary co-efficient ($Z_m^{train}$) are obtained corresponding to the electrical loads (m) using a pre-trained dictionary. The dictionary is pre-trained using the dictionary learning for every load using the load specific consumption ($X_m$) corresponding to the electrical load (m). The load consumption ($\widehat{X_m}$) for each electrical load (m) among the plurality of electrical loads (M) is estimated using the estimated energy coefficient ($Z_m^{test}$) with the corresponding dictionary ($D_m$). The method iteratively, performs for each electrical load (m+1) among the plurality of electrical loads (M) by, re-computing, a new aggregated load data ($\overline{X}_{test}$) by subtracting the estimated load energy consumption ($\widehat{X_m}$) from the previous load consumption ($\overline{X}_{test}$) value and re-computing, the new total load consumption (X) by subtracting the estimated load energy consumption ($\widehat{X_m}$) and the load specific consumption ($X_m$) from the previous total load consumption (X).

In yet another aspect, provides one or more non-transitory machine-readable information storage mediums comprising one or more instructions, which when executed by one or more hardware processors perform actions includes preprocessing receive a aggregated load data ($\overline{X}_{test}$) obtained from a utility meter among a plurality of utility meters at a plurality of regular time intervals. The aggregated load data comprises total energy consumed by a plurality of electrical loads connected to the corresponding utility meter and base loads which are low power loads. The system further receives a training data ($\overline{X}_{train}$), wherein the training data is generated from the plurality of utility meters. The aggregate load data ($\overline{X}_{test}$) and the training data ($\overline{X}_{train}$) is represented as a matrix, where a column vector represents the plurality of regular time intervals covered in a predefined time period and a row vector represents a total number of predefined time periods considered. Further, a disaggregated energy load at low sampling rate for the aggregated load data ($\overline{X}_{test}$) of each utility meter is determined using an energy disaggregation technique. This technique comprises obtaining, a total load consumption (X) using the aggregated load data ($\overline{X}_{test}$) and the training data ($\overline{X}_{train}$). Further, a laplacian graph ($L_m$) is constructed for each electrical load (m) using the total load consumption (X). Further, an optimization model is formulated for estimating the dictionary coefficient ($Z_m^{test}$) of each electrical loads (m). The dictionary coefficient ($Z_m^{test}$) of each electrical loads (m) is estimated using the laplacian graph ($L_m$), a dictionary ($D_m$) and a dictionary co-efficient ($Z_m^{train}$), wherein, the dictionary ($D_m$) and the dictionary co-efficient ($Z_m^{train}$) are obtained corresponding to the electrical load (m) using a pre-trained dictionary. The dictionary is pre-trained using the dictionary learning for every load using the load specific consumption ($X_m$) corresponding to the electrical load (m). The load consumption ($\widehat{X_m}$) for each electrical load (m) among the plurality of electrical loads (M) is estimated using the estimated energy coefficient ($Z_m^{test}$) with the corresponding dictionary ($D_m$). The system iteratively, performs for each electrical load (m+1) among the plurality of electrical loads (M) by, re-computing, a new aggregated load data ($\overline{X}_{test}$) by subtracting the estimated load energy consumption ($\widehat{X_m}$) from the previous load consumption ($\overline{X}_{test}$) value and re-computing, the new total load consumption (X) by subtracting the estimated load energy consumption ($\widehat{X_m}$) and the load specific consumption ($X_m$) from the previous total load consumption (X).

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION OF EMBODIMENTS

Figure 1:
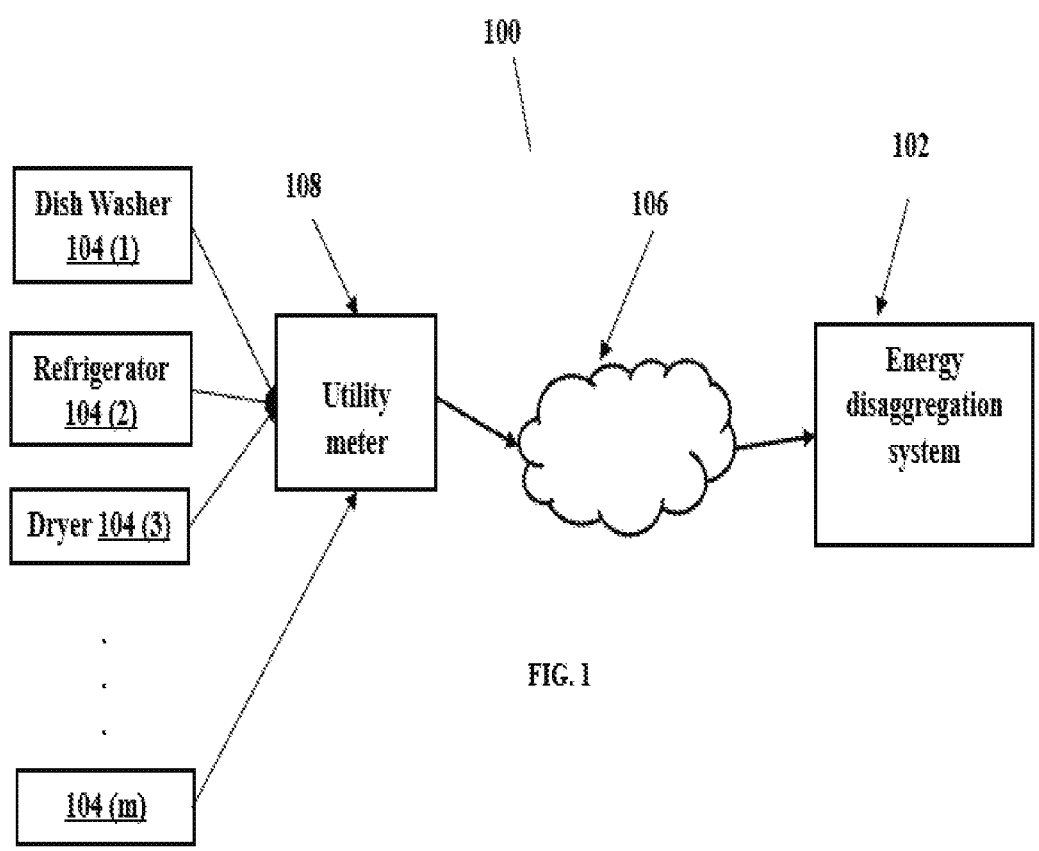
FIG. 1 illustrates an example environment implementing a system, alternatively referred as energy load disaggregation system, representing a method for disaggregation of electrical loads configured to each utility meter, in accordance with some embodiments of the present disclosure.

Exemplary embodiments are described with reference to the accompanying drawings. In the figures, the left-most digit(s) of a reference number identifies the FIG. 10 in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following claims.

The embodiments herein provide a method and a system, interchangeably referred as energy load disaggregation system for determining the disaggregated energy of the electrical load(s) or appliance (s) from the power data at low sampling rate. The electrical load may also be referred as aggregated power data. The aggregate power data is the total amount of energy load consumed by all the electrical appliances configured to the corresponding utility meter among a plurality of utility meters. The method disclosed determines energy consumed by all the individual appliance(s) of a house or a building from the aggregate power data using an energy disaggregation technique. The term 'disaggregated energy load' may refer to an amount of energy that may be consumed by a single or individual appliance configured to the corresponding utility meters available in the electrical network. Further, as used in the present disclosure, the term "load or appliance" may refer to any device that is capable of consuming electricity. For example, it may be a dish washer, refrigerator, dryer or any other device which consumes energy.

In an embodiment to effectively address 15- or 30-minutes energy load disaggregation, and to obtain a good estimate of load consumption, the present disclosure presents an analytical formulation blending the sparse dictionary representation and graph signal smoothness based on label propagation for energy load disaggregation. The dictionaries learn individual load characteristics in terms of magnitude and time of operation. The coefficients select the right dictionary columns (atoms) and scale them appropriately to facilitate the discrimination of loads. The graph-signal based label propagation identifies the timings of load operation in a more accurate way though having small amount of training data and further refines the individual load estimation. This technique achieved an accuracy greater than or equal to 70% for the loads of interest. The disclosed technique performs better accuracy than the standard GSP and dictionary-based methods which are known in the art. This technique receives aggregate power data at predefined regular intervals for the duration of N days along with individual power consumed by the M appliances for n days at a low rate (T samples in a day).

Referring now to the drawings, and more particularly to FIG. 1 through FIG. 6, where similar reference characters denote corresponding features consistently throughout the figures, there are shown preferred embodiments and these embodiments are described in the context of the following exemplary system and/or method.

FIG. 1 illustrates an example environment implementing a system, alternatively referred as energy load disaggregation system, representing a method for disaggregation of electrical loads configured to each utility meter, in accordance with some embodiments of the present disclosure. As depicted, in the example herein, the system 102 is configured to the plurality of utility meters, where each utility meter is configured to all the energy consuming devices in a house or a building. The energy consuming devices may include a dish washer 104(1), refrigerator 104(2), dryer 104(3) or any other energy consuming appliances 104(M). Each utility meter may record the total energy consumed by all the connected appliances of the house or building and thereof. Further, the aggregate load data ($\overline{X}_{test}$) which is the total energy consumed and measured or indicated by the utility meter is fed to the system 102 or the energy disaggregation system 102. Further the system 102 analyses the aggregated load data ($\overline{X}_{test}$) to determine the disaggregated energy load at low sampling rate of each utility meter utilizing the training data ($\overline{X}_{train}$) The system 102 is further explained in detail in conjunction with functional modules of FIG. 2 and flow diagram of FIG. 3 for determining disaggregated energy of the loads/appliances 104(1), 104(2), 104(3), . . . 104($m$), wherein m=1, 2, 3 . . . M may go incrementally till M, configured to the corresponding utility meter.

Figure 2:
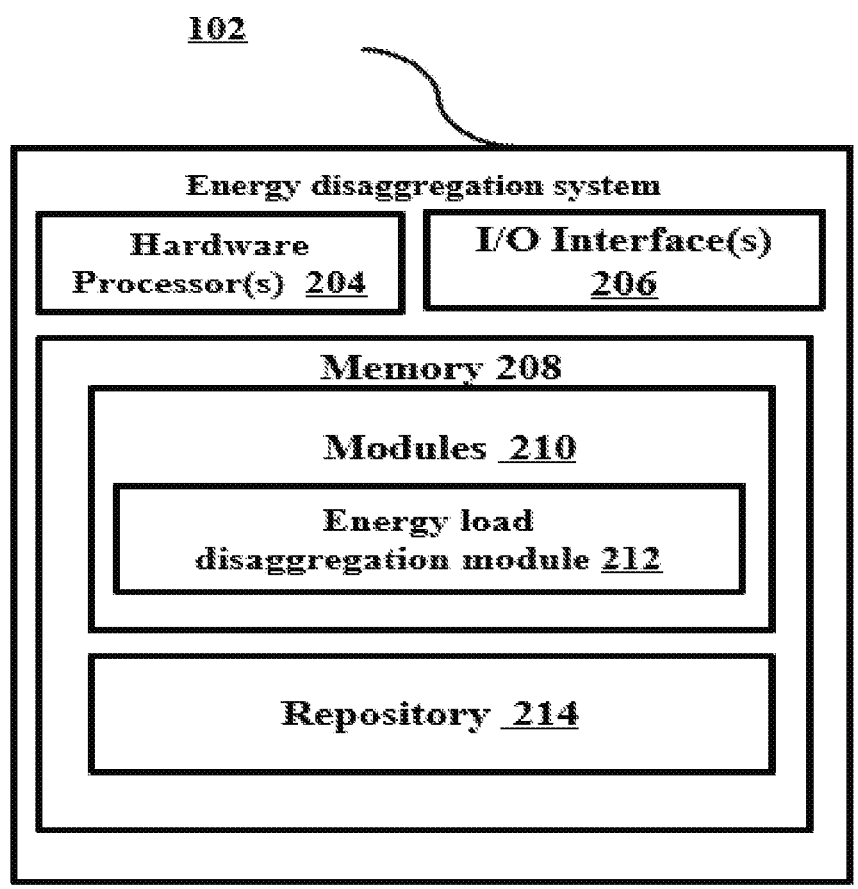
FIG. 2 illustrates a functional block diagram of the energy load disaggregation system of FIG. 1, in accordance with some embodiments of the present disclosure.

FIG. 2 illustrates a functional block diagram of the energy load disaggregation system of FIG. 1, in accordance with some embodiments of the present disclosure. In an embodiment, the energy load disaggregation system 102 includes processor (s) 204, communication interface device(s), alternatively referred as or input/output (I/O) interface(s) 206, and one or more data storage devices or memory 208 operatively coupled to the processor (s) 204. The processor (s) 204 may be alternatively referred as one or more hardware processors 204. In an embodiment, the hardware processors can be implemented as one or more microprocessors, microcomputers, microcontrollers, digital signal processors, central processing units, state machines, logic circuitries, and/or any devices that manipulate signals based on operational instructions. Among other capabilities, the processor(s) 204 is configured to fetch and execute computer-readable instructions stored in the memory. In an embodiment, the system 102 can be implemented in a variety of computing systems, such as laptop computers, notebooks, hand-held devices, workstations, mainframe computers, servers, a network cloud and the like.

The I/O interface(s) 206 can include a variety of software and hardware interfaces, for example, a web interface, a graphical user interface, and the like and can facilitate multiple communications within a wide variety of networks N/W and protocol types, including wired networks, for example, LAN, cable, etc., and wireless networks, such as WLAN, cellular, or satellite. In an embodiment, the I/O interface device(s) can include one or more ports for connecting a number of devices to one another or to another server for verifying software code.

The memory 208 may include any computer-readable medium known in the art including, for example, volatile memory, such as static random access memory (SRAM) and dynamic random access memory (DRAM), and/or nonvolatile memory, such as read only memory (ROM), erasable programmable ROM, flash memories, hard disks, optical disks, and magnetic tapes. The memory 208 further may include modules 210. In an embodiment, the modules 210 include an energy load disaggregation module 212, for implementing functions of the system 102. In an embodiment, the modules 210 can be an Integrated Circuit (IC) (not shown), external to the memory 208, implemented using a Field-Programmable Gate Array (FPGA) or an Application-Specific Integrated Circuit (ASIC). The names (or expressions or terms) of the modules of functional block within the modules 210 referred herein, are used for explanation and are not construed to be limitation(s). Further, the memory 208 can also include the repository 214. The repository 214 may store the training data. The memory 208 may further comprise information pertaining to input(s)/output(s) of each step performed by the system 10 and methods of the present disclosure. The system 102 can be configured to process the aggregated load data ($\overline{X}_{test}$) input data, obtained from the utility meter among the plurality of utility meters at low sampling rate. In the sampled power measurements, since there are no events and signatures associated with loads operation, the disclosed technique makes use of dictionary representation and smoothness of the representation coefficients to disaggregate loads in an iterative manner. The method involves utilizing the training data obtained from the pre-trained module, where dedicated dictionaries are learnt for all the individual loads of interest. In the test phase, the aggregated load data ($\overline{X}_{test}$) is processed using the learnt load dictionary and graph smoothness as an additional constraint for solving the optimization model to estimate the constituent loads. Further, processing the aggregated load data ($\overline{X}_{test}$) in the test phase using the disclosed technique will be explained with reference to the accompanying diagrams FIG. 3 and FIG. 4.

Figure 3:
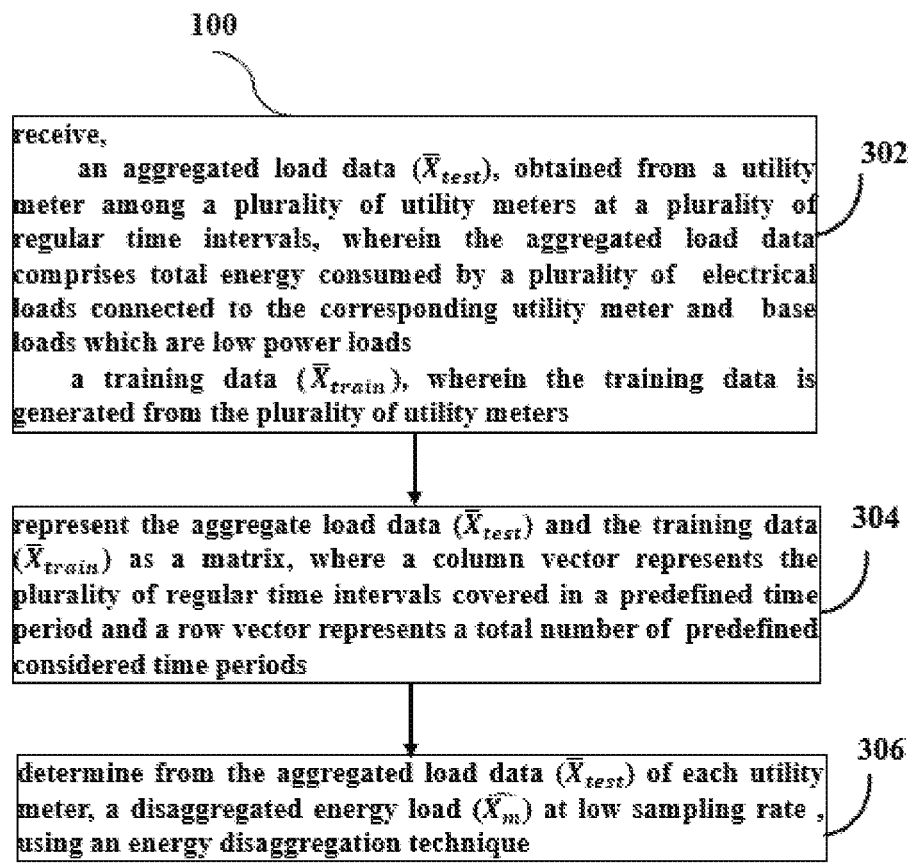
FIG. 3 is a flow diagram illustrating a method for disaggregation of energy loads using the system of FIG. 1 functionally described in FIG. 2, in accordance with some embodiments of the present disclosure.

FIG. 3 is a flow diagram illustrating a method for disaggregation of electrical loads using the system of FIG. 1 functionally described in FIG. 2, in accordance with some embodiments of the present disclosure.

Figure 4:
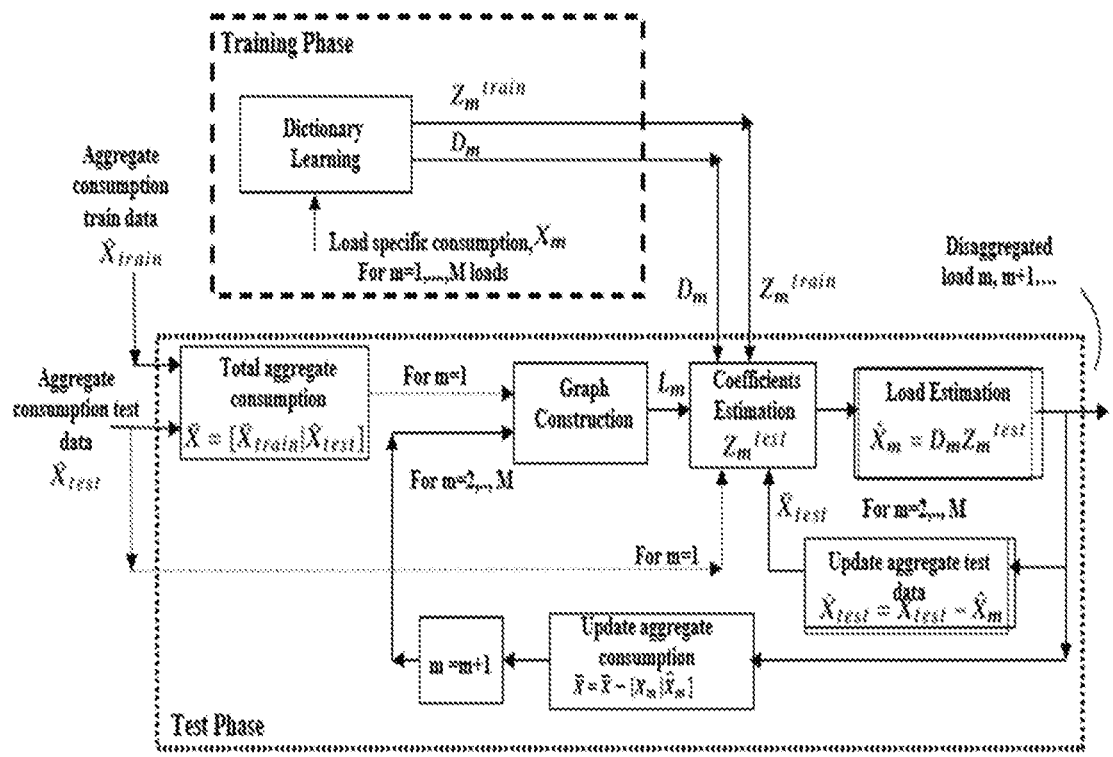
FIG. 4 is a high-level architecture for disaggregating energy loads using the system of FIG. 1, to calculate the energy usage of the loads or appliances connected to the corresponding utility meter in accordance with some embodiments of the present disclosure.

The steps of the method 300 of the flow diagram will now be explained with reference to the components or blocks of the system 100 in conjunction with the example architecture of the system as depicted in FIG. 4. Here, FIG. 4 is a high-level architecture for disaggregating energy loads using the system of FIG. 1, to calculate the energy usage of the loads or appliances connected to the corresponding utility meter in accordance with some embodiments of the present disclosure. In an embodiment, the system 102 comprises one or more data storage devices or the memory 208 operatively coupled to the one or more processors 204 and is configured to store instructions for execution of steps of the method 300 by the one or more processors 204. Although process steps, method steps, techniques or the like may be described in a sequential order, such processes, methods and techniques may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

At step 302 of the method 300, the processor 204 is configured to receive a aggregated load data ($\bar{X}_{test}$) and a training data ($\bar{X}_{train}$). Referring now to FIG. 1 and FIG. 4 depicting an example, where the energy consumed appliances are configured to the corresponding utility meter. Electrical load disaggregation can be viewed as a source separation problem where, given an aggregated load data ($\bar{X}_{test}$), the individual loads that contributed to the aggregate consumption is computed. Mathematically, it can be represented as given in equation 1, $$p(i) = \sum_{m=1}^{M} Pm(i) + n(i) \quad (1)$$

where, p(i) is the aggregate power measurement sampled at time instants i=1, 2, 3 ..., N.

Pm(i) are the individual loads for m∈M contributed to that measurement and n(i) is the measurement noise which includes the base loads (combined low power loads).

In an embodiment, the system 102 is configured to receive the aggregated load data ($\bar{X}_{test}$) including the total amount of energy consumed by all the appliances configured to the utility meter. This aggregated load data ($\bar{X}_{test}$) is the input data obtained from the utility meter among the plurality of utility meters at a plurality of regular time intervals. Here, the aggregated load data ($\bar{X}_{test}$) comprises total energy consumed by a plurality of electrical loads connected to the corresponding utility meter and base loads which are low power loads. Subsequently, the system 102 fetches the training data ($\bar{X}_{train}$) obtained from the plurality of utility meters, wherein the system 102 is pre-trained with the training data ($\bar{X}_{train}$).

At step 304 of the method 300, the processor 204 is configured to represent, the aggregate load data ($\bar{X}_{test}$) and the training data ($\bar{X}_{train}$) as a matrix, where column vector represents the plurality of regular time intervals covered in a predefined time period and row vector represents a total number of predefined time periods considered. The aggregate power measurements are represented as $\tilde{X} \in R^{T*N}$, where the rows T are the measurements in a day and the columns N are the total number of days considered for training data ($\bar{X}_{train}$) and ($\bar{X}_{test}$). Let the individual load power measurements for m=1, 2, 3 ... M loads be given as $X_m \in R^{T*n}$ where n (n<N) are the number of days considered for training data ($\bar{X}_{train}$) for which the individual load power measurements are known such that it can be is represented as given in equation 2, $$\bar{X}_{train} = \sum_{m=1}^{M} X_m + B \quad (2)$$

where, B includes the base loads and other loads not considered in M. For each of the individual loads $X_m$ a sparse representation using the corresponding overcomplete dictionary $D_m$ is learnt. Since we are considering the power consumption, non-negative sparse coding version of K-SVD is used to learn sparse representation of the loads which leads to the following formulation as represented in equation 3, $$\min_{D_m, Z_m} \|X_m - D_m Z_m^{train}\|_F^2 \quad \text{s.t.} \quad \|Z_m^{train}\|_0 \leq \tau \quad (3)$$

where, $D_m \in R^{T*K}$, is the dictionary with K atoms and $Z_m^{train} \in R^{K*n}$ are the dictionary coefficients or activations. The second term, $\|Z_m^{train}\|_0$ is the $l_o$ sparsity measure which ensures a sparse representation of data is learnt using at most τ atoms (columns) of the dictionary. In the actual implementation of the optimization step, the convex surrogate, $l_1$ norm of the coefficients is used instead of the $l_0$ norm.

At step 306 of the method 300, the processor 204 is configured to determine the disaggregated load energy at low sampling rate for the aggregated load data ($\bar{X}_{test}$) of each utility meter, using an energy disaggregation technique. Referring now to FIG. 4 considering the example FIG. 1, the method obtains total load consumption ($\bar{X}$) using the aggregated load data ($\bar{X}_{test}$) and the training data ($\bar{X}_{train}$), wherein the total load consumption ($\bar{X}$) can be represented as mentioned below in equation 4, $$\text{Total load consumption } (\bar{X}) = [\bar{X}_{test} | \bar{X}_{train}] \quad (4)$$

For the given aggregated load data ($\bar{X}_{test}$), $\bar{X}test \in R^{T*(N-n)}$, the dictionary coefficients $Z_m^{test}$ corresponding to each of the loads is computed by solving the following optimization model as represented in equation 5, $$\min_{Z_m} \|\bar{X} - \sum_{m \in M} D_m Z_m\|_F^2 + \beta \sum_{m \in M} tr(Z_m L_m Z_m^T) \quad (5)$$

where, $\bar{X} = [\bar{X}_{test} | \bar{X}_{train}]$ and $Z_m = [Z_m^{train} | Z_m^{test}]$ are the activations for load m. $D_m$ is the load specific dictionary learnt in the training phase.

Further, the method constructs a Laplacian graph ($L_m$) for each electrical load (m) using the total load consumption ($\bar{X}$). The Laplacian graph ($L_m$) is the combinatorial graph Laplacian computed from the aggregate power measurements when m-th load is considered for disaggregation. Here, tr( ) is the trace of the matrix.

Further, the method formulates, an optimization model for estimating the dictionary coefficient ($Z_m^{test}$) of each electrical loads (m). The first term of the optimization model as specified in equation 5, estimates the coefficients using the learnt dictionaries such that the error between $\bar{X}$ and product of $D_m Z_m$ is minimized. The 15 second term is the graph smoothness term that treats the dictionary coefficients ($Z_m$) as graph signals and ensures the coefficients are smooth with respect to the underlying graph ($L_m$).

Further, the method, constructs a graph using the total load consumption ($\bar{X}$) and considers the dictionary coefficient ($Z_m^{test}$) as graph signal for the graph regularize constraint added to the optimization model. The dictionary coefficient ($Z_m^{test}$) of each electrical loads (m) is estimated using the optimization model utilizing the laplacian graph ($L_m$), a dictionary ($D_m$) and a dictionary co-efficient ($Z_m^{train}$). The dictionary ($D_m$) and the dictionary co-efficient ($Z_m^{train}$) are obtained corresponding to the electrical load (m) using a pre-trained dictionary and the dictionary is pre-trained using the dictionary learning for every load specific consumption ($X_m$) corresponding to the electrical load (m).

Since the dictionaries for the electrical loads are computed only once at the time of training and are considered fixed, the graph smoothness term helps in accurately picking up the timing instants of the electrical load operation in the test phase. This addresses the problem of capturing the random switching of loads mentioned earlier. A graph of N nodes is constructed using the aggregate power measurements $\overline{X}$ with T samples (one day) residing on each node. In order to identify simultaneous operation of different loads, $\Delta p$ values (power variation between adjacent aggregate power measurements) are considered instead of raw power measurements for graph construction. Traditional Gaussian kernel weighting function is used to define connections between the nodes is represented in equation 6, $$W(i,j) = \exp(-|\text{dist}(i,j)|^2/\sigma^2) \quad (6)$$

where, $\sigma$ is a scaling factor and (dist(i,j)) is the distance measure between nodes i and j which can be chosen based on the application. Since a vector resides on each node, here, Euclidean distance is considered to compute the weights of the graph. The graph Laplacian L is obtained as: $L=D^G-W$, where, $D^G$ is the degree matrix and W is the weight matrix obtained from equation 5. The rationale behind using the graph is that, similar load operations will have similar activations or coefficients and the same can be propagated from the training to the test phase. This enables the timing instants of the load operation to be picked up more accurately. Since the coefficients $Z_m^{train}$ are known for the training data, the optimization model represented in equation 5 and is solved for $Z_m^{test}$ in a greedy manner by estimating one load at a time. The optimization model problem is re-formulated as mentioned in equation 7, $$\min_{Z_m^{test}} \|\overline{X}_{test} - D_m Z_m^{test}\|_F^2 + \beta \, tr(Z_m L_m Z_m^T) \quad (7)$$

Constraints of Optimization Model,
1. estimating, the dictionary coefficient ($Z_m^{test}$) using the dictionary ($D_m$) such that error between ($\overline{X}_{test}$) and the product of the dictionary ($D_m$) and the dictionary coefficient ($Z_m^{test}$) is minimized and
2. determining, the dictionary coefficient ($Z_m^{test}$) for load m such that the total variation over the graph topology ($L_m$) is minimized, in other words, the coefficients are smooth with respect to the graph.

The graph smoothness in equation 8 is expressed as:

$$Z_m L_m Z_m^T = Z_m(:,1:n) L_m(1:n,1:n) Z_m(:,1:n)^T + Z_m(:,1:n) \\
L_m(1:n,1:n+1:N) Z_m(:,n+1:N)^T + Z_m(:,n+1:N) L(n+ \\
1:N,1:n) Z_m(:,n+1:n)^T + Z_m(:,n+1:N) L_m(n+1:N,n+1: \\
N) Z_m(:,n+1:N)^T \quad (8)$$

Where, $Z_m(:,1:n) = Z_m^{train}$ and $Z_m(:,n+1:N) = Z_m^{test}$. This is an extension of the graph smoothness term expansion to accommodate vector valued graph signals. Since, $Z_m^{train}$ is known $L_m$ is symmetric, minimizing the graph smoothness term results in represented in equation 9, $$\min_{Z_m} tr(Z_m L_m Z_m^T) = \min_{Z_m^{test}} tr\|2 Z_m^{test} L_m(n+1:N, 1:n)(Z_m^{train})^T + \\
Z_m^{test} L_m(n+1:N, n+1:N)(Z_m^{train})^T \quad (9)$$

Solving for $Z_m^{test}$ by taking a derivative of equation 7 with respect to $Z_m^{test}$ and equating it to zero results in Sylvester equation (5) of the form as represented in equation 10, $$D_m^T D_m Z_m^{test} + \beta Z_m^{test} L_m(n+1:N,n+1:N) = D_m^T \\
\overline{X}_{test} - \beta Z_m^{train} L_m(n+1:N,n+1:n)^T \quad (10)$$

Since the graph construction at a given iteration is more influenced by the highest power consuming load, the latter is disaggregated first treating the contribution of other loads as interference.

Further, the method estimates load consumption ($\widehat{X_m}$) for each electrical load (m) among the plurality of electrical loads (M) using the estimated energy coefficient ($Z_m^{test}$) with the corresponding dictionary ($D_m$) as represented in equation 11, $$\widehat{X_m} D_m Z_m^{test} \quad (11)$$

Once the aggregated load data is disaggregated its contribution is removed from the aggregate power measurement for $\overline{X}_{test}$ and $\overline{X}$. The method iteratively performs for each electrical load (m+1) among the plurality of electrical loads (M) for re-computing, a new aggregated load data ($\overline{X}_{test}$). A new graph is created for the next load using the $\Delta p$ values of $\overline{X}$. Then, the new total load consumption ($\overline{X}$) is recomputed by subtracting the estimated load energy consumption ($\widehat{X_m}$) and the load specific consumption ($X_m$) from the previous total load consumption ($\overline{X}$) as represented in equation 12, $$\overline{X} = \overline{X} - [X_m, \hat{X}_m] \quad (12)$$

The $\overline{X}_{test}$ is computed by subtracting the estimated load energy consumption ($\widehat{X_m}$) from the previous load consumption ($\overline{X}_{test}$) value. The test aggregate is also modified as represented in equation 13, $$\overline{X}_{test} = [\overline{X}_{test} - \hat{X}_m] \quad (13)$$

and the procedure repeats for the next load till all the loads of interest are disaggregated.

In an embodiment, the potential of the disclosed methodology for load disaggregation is demonstrated using two datasets, the simulated one using Home Energy Simulator (HES) and the public UMass Smart Home Dataset, with power data sampled at 15 and 30 minutes respectively. Here, dictionaries for the different loads are learnt using the K-SVD toolbox in Matlab with K=100 atoms and sparsity threshold T=20. The value of $\beta$ is chosen to provide more importance to the graph smoothness term while estimating the load activations. The disaggregation results are evaluated for both load identification and consumption estimation. The well-known F1 score, which is the harmonic mean of precision and recall is used for load identification. For load consumption estimation, normalized Root Mean Squared Error (NRMSE) and normalized Mean Absolute Error (NMAE) metrics are considered to evaluate the waveform reconstruction capability of the respective loads.

These performance metrics are defined as represented in equation 14, $$F1\ score = \frac{2*Recall*Precsision}{Recall+Precision} \quad (14)$$

Where, Precsision=TP/(TP+FP) and Recall=TP/(TP+FN)
TP=true positives, FP=false positives and FN=false negatives
The normalized Root Mean Squared Error (NRMSE) is represented in equation 15, $$RMSE = \sqrt{\frac{\Sigma_{i \in n}(X_{act} - X_{pred})^2}{n}} \quad (15)$$

The normalized Mean Absolute Error (NMAE) metrics is represented in equation 16, $$MAE = \frac{\Sigma_{i \in n}|X_{act} - X_{pred}|}{n} \quad (16)$$

where $X_{act}$ is the actual and $X_{pred}$ is the estimated power consumption of the load. The normalized values are obtained by dividing these metrics by the average power consumption of the respective loads. electrical loads (m) with distinct power levels are only considered for disaggregation. Base load (combined low power) removal is not considered here as they may remove the loads of interest and adversely affect the accuracy of both load detection and estimation. In addition, the average percentage accuracy of the load consumption estimation is provided for comparative analysis. It is known, in the low sampling regime it is difficult to disaggregate all possible loads.

Reasonable detection and consumption accuracy of major power consuming loads can provide valuable insights to both consumers and utilities. Hence, major power consuming loads with distinct power levels are considered for disaggregation. Since the suggested methodology systematically combine disaggregation vis discriminative sparse coding (DDSC) and graph signal processing (GSP) in the directions of providing comparative results for the available prior arts are evaluated for both the data sets.

Figure 5:
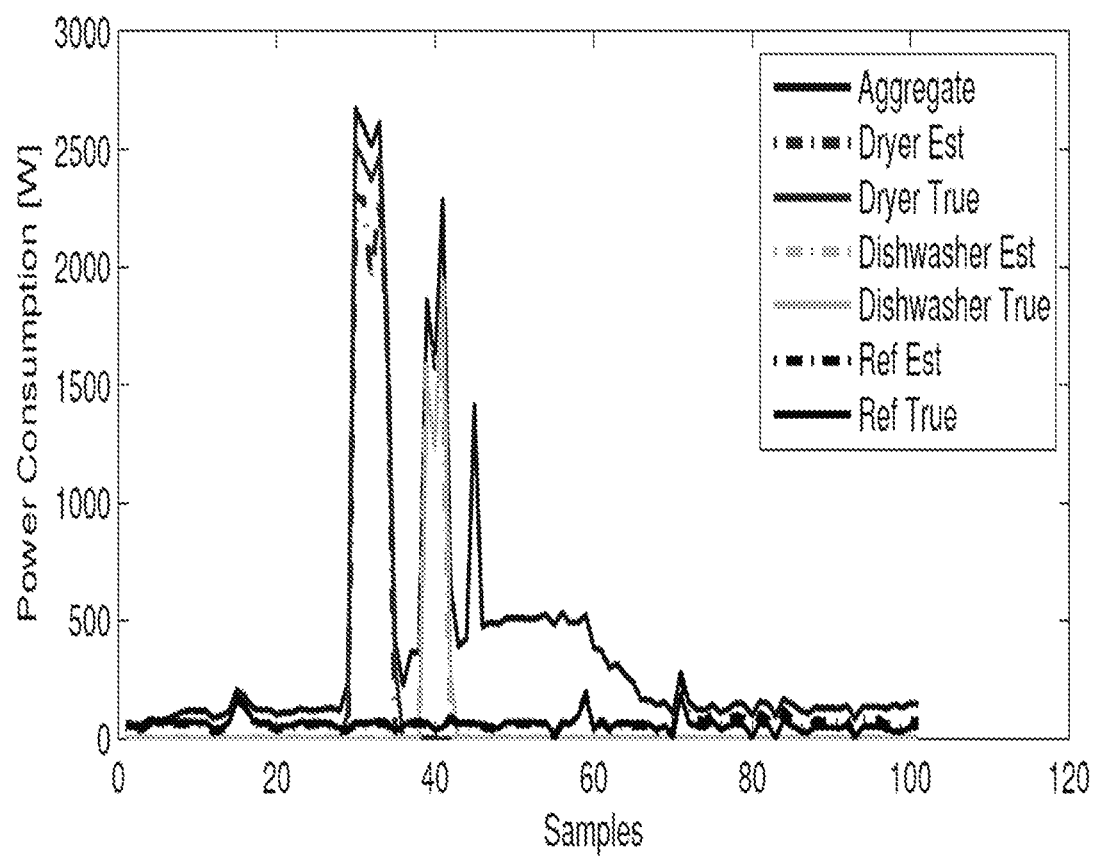
FIG. 5 is a graphical representation of the energy load disaggregation results for 1 day using 15 minutes sampled HES dataset, in accordance with some embodiments of the present disclosure.

FIG. 5 is a graphical representation of the energy load disaggregation results for 1 day using 15 minutes sampled HES dataset, in accordance with some embodiments of the present disclosure. This dataset makes use of load signatures extracted from REDD and trace base datasets to mimic the loads in a residential setup. The simulator can generate 10 second sampled power measurements. This data is appropriately down sampled to 15-minute intervals and considered for disaggregation. Commonly used loads in the household namely, Dryer, Dishwasher, Geyser and Refrigerator and base loads are considered to generate the near realistic data for 300 days. A graph of 300 nodes is constructed using the normalized Δp values of the aggregate power measurements with σ=0.5. Load specific dictionaries are trained using 190 days data to ensure different load switching timings are captured. The testing is carried out for the remaining 110 days.

In an embodiment, the disclosed method is able to disaggregate only three loads namely, Dryer, Dishwasher and Refrigerator with good accuracy. The identification in terms of F1 score and consumption estimates in terms of average percentage accuracy (% Acc) obtained by all the three methods for identification and consumption estimates obtained as represented as mentioned below in Table 1,

TABLE 1

Comparative results with HES dataset

| Load | Energy disaggregation technique | | DDSC | | GSP | |
|---|---|---|---|---|---|---|
| | F1 | % Acc | F1 | % Acc | F1 | % Acc |
| Dryer | 0.91 | 86.47 | 0.43 | 51.05 | 0.90 | 70.59 |
| Dish Washer | 0.81 | 76.60 | 0.39 | 58.48 | 0.80 | 67.04 |
| Refrigerator | 1 | 73.48 | 1 | 40.51 | 1 | 63.43 |

It can be seen, both the GSP technique and the disclosed method have similar detection accuracy (F1 score), however, the consumption accuracy of latter is higher. This is because the dictionary representation helps in better load waveform reconstruction. On the other hand, the DDSC method on its own has low detection accuracy since it requires enormous historical data to capture different possible operational instants of loads to perform effectively. Even with the reasonable amount of training data considered for experimentation, the technique resulted in poor accuracy. The combination of Dictionary representation and the GSP technique resulted in improved accuracy metrics.

Figure 6:
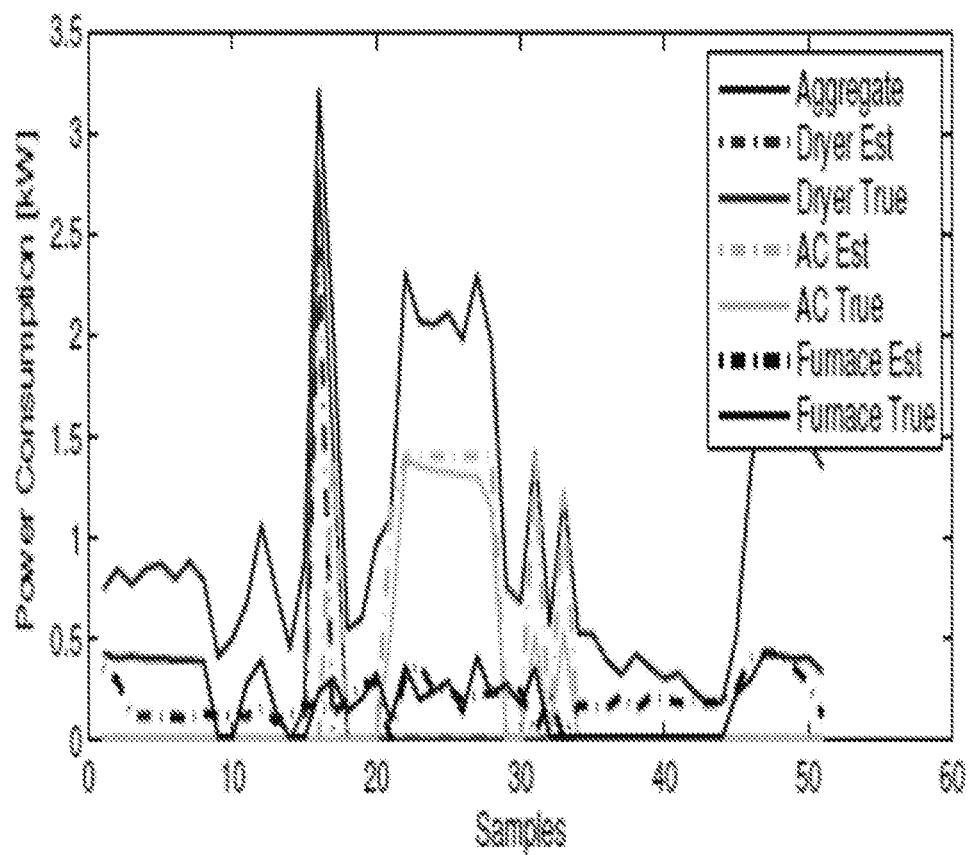
FIG. 6 is a graphical representation of the energy load disaggregation results for 1 day using 30 minutes sampled UMass dataset, in accordance with some embodiments of the present disclosure.

FIG. 6 is a graphical representation of the energy load disaggregation results for 1 day using 30 minutes sampled UMass dataset, in accordance with some embodiments of the present disclosure. In an embodiment, public dataset which contains power data collected by different sensors in three real homes for three years sampled at 30-minute intervals. Apart from the power measurements it also contains the weather information which can be used for energy forecasting. UMass data mainly comprises of Dryer, AC, Furnace, Microwave, Refrigerator and base loads. For this data, 365 days are considered for training where load specific dictionaries are learnt, and 100 days are considered for testing. A graph of 465 nodes is constructed to estimate the load activations in the test phase. The disclosed method can disaggregate the three commonly used loads namely, Dryer, AC and Furnace. The identification and consumption estimates obtained with the GSP technique and the proposed method are summarized in Table 2,

TABLE 2

Comparative results with UMASS dataset

| Load | Energy disaggregation technique | | GSP | |
|---|---|---|---|---|
| | F1 | % Acc | F1 | % Acc |
| Dryer | 0.764 | 82.83 | 0.74 | 44.15 |
| AC | 0.755 | 76.61 | 0.67 | 65.79 |
| Furnace | 1 | 71.78 | 1 | 64.90 |

For this case also, the disclosed technique performed better than the GSP method both in terms of identification and consumption estimation. The performance of DDSC method is very poor and is not considered for comparison.

In one embodiment, the energy loads are disaggregated in an iterative manner starting from the high-power consuming load, false negatives leads to false positives for the next load being considered and vice-versa. To reduce this error propagation, appropriate post processing is done on the load estimation. Here, a threshold is applied on the load estimations, where the threshold is half of the maximum magnitude of the load power waveform. The load values above the threshold is considered as valid estimations. This simple step results in a decent identification of loads with distinct power levels. For the case of continuously ON loads, although the contributions of other similar power loads are subsumed, still the algorithm can detect them due to their regularity of operation. It is worth noting that, the disclosed optimization formulation exploits the energy consumption behavior of the consumer. It estimates the load activations based on the similar power consumption profile seen in the training phase. Hence, it is able to accurately pick the timing instants of load operation even when these instances are not seen in the training. This leads to an advantage in terms of working with less amount of training data. The accuracy of load consumption estimation in terms of NRMSE and NMAE obtained with the disclosed method for both the datasets are summarized in table 3.

TABLE 3

Accuracy of load consumption estimation for both the datasets

| Load | NRMSE | NMAE |
| --- | --- | --- |
| HES dataset | | |
| Dryer | 0.174 | 0.131 |
| Dishwasher | 0.281 | 0.204 |
| Refrigerator | 0.385 | 0.254 |
| UMass dataset | | |
| Dryer | 0.203 | 0.161 |
| AC | 0.212 | 0.160 |
| Furnace | 0.369 | 0.313 |

As is evident from the results (Tables 1-3), the accuracy of load identification and consumption estimation goes down as the sampling intervals increases from 15 minutes to 30 minutes. This is because at those sampling instants, some of the loads may exhibit similar power values leading to more complex superpositions. It is useful to note that the deterioration of the disclosed method is less compared to GSP technique, when we move from 15 minutes to 30 minutes data. This justifies the importance of having a suitable representation together with GSP to effectively handle disaggregation of low-sampled data. Further, the good estimation and consumption accuracies achieved through this method can facilitate load profiling of consumers and their segmentation in a more effective manner.

The embodiments of present disclosure herein addresses unresolved problem of low sampling rate electrical load disaggregation. The embodiment thus provides the necessity of systematically combining signal processing and machine learning based on mathematical formulations to arrive at algorithms for load disaggregation from low sampled power data. Moreover, the embodiments herein further provide an appropriate data/signal representation coupled with graph signal processing for low sampled load disaggregation. Here, the concepts of dictionary learning and graph signal processing are combined to arrive at a novel methodology for disaggregating major power consuming loads in residential buildings. Dictionaries are used to characterize the different loads in terms of power values and time of operation. The coefficients thus obtained are treated as graph signals and graph smoothness is used to propagate the coefficients from the known training phase to the test phase.

The present disclosure provides the optimization formulation, the derivation of the requisite solution steps to identify the loads of interest and estimate their power consumption. Towards demonstrating the usefulness of the technique, typical results for both simulated and real data are provided.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software processing components located therein. Thus, the means can include both hardware means, and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various components described herein may be implemented in other components or combinations of other components. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A processor implemented (102) method for electrical load disaggregation, wherein the method comprises:
receiving, by a processor (204),
an aggregated load data ($\overline{X}_{test}$), obtained from a utility meter among a plurality of utility meters at a plurality of regular time intervals, wherein the aggregated load data comprises total energy consumed by a plurality of electrical loads (m) connected to a utility meter and base loads which are low power loads; and
a training data ($\overline{X}_{train}$), wherein the training data is generated from the plurality of utility meters;
representing, by the processor (204), the aggregate load data ($\overline{X}_{test}$) and the training data ($\overline{X}_{train}$) as a matrix, where a column vector represents the plurality of regular time intervals covered in a predefined time period and a row vector represents a total number of predefined time periods considered; and
determining, by the processor (204), from the aggregated load data ($\overline{X}_{test}$) of the utility meter, a disaggregated energy load ($\widehat{X_m}$) at low sampling rate, using an energy disaggregation technique comprising:
obtaining, a total load consumption ($\overline{X}$) using the aggregated load data ($\overline{X}_{test}$) and the training data ($\overline{X}_{train}$);
constructing, a laplacian graph ($L_m$) for each of the plurality of electrical load (m) using the total load consumption ($\overline{X}$);
formulating, an optimization model for estimating the dictionary coefficient ($Z_m^{test}$) of each of the plurality of electrical loads (m);
estimating, the dictionary coefficient ($Z_m^{test}$) of each electrical loads (m), using the laplacian graph ($L_m$), a dictionary ($D_m$) and a dictionary co-efficient ($Z_m^{train}$),
wherein, the dictionary ($D_m$) and the dictionary co-efficient ($Z_m^{train}$) are obtained for each of the electrical load (m) using a pre-trained dictionary, and
wherein, the dictionary is pre-trained using the dictionary learning for each electrical load (m) load using a load specific consumption ($X_m$) corresponding to the electrical load (m);
estimating, the load consumption ($\widehat{X_m}$) for each electrical load (m) among the plurality of electrical loads (M) using the estimated energy coefficient ($Z_m^{test}$) with the corresponding dictionary ($D_m$); and
iteratively, performing for each electrical load (m) among the plurality of electrical loads (M) steps of:

re-computing, a new aggregated load data ($\overline{X}_{test}$) by subtracting the estimated load energy consumption ($\widehat{X_m}$) from the previous load consumption ($\overline{X}_{test}$) value; and
re-computing, the new total load consumption ($\overline{X}$) by subtracting the estimated load energy consumption ($\widehat{X_m}$) and the load specific consumption ($X_m$) from the previous total load consumption ($\overline{X}$).

2. The method as claimed in claim 1, wherein the optimization model for estimating the dictionary coefficient ($Z_m^{test}$) of each electrical loads (m) by,
construct, a graph using the total load consumption ($\overline{X}$), considering the dictionary coefficient ($Z_m$) as the graph signal.

3. The method as claimed in claim 2, wherein the optimization model constraints includes,
estimating, the dictionary coefficient ($Z_m^{test}$) using the dictionary ($D_m$) such that error between ($\overline{X}_{test}$) and the product of the dictionary ($D_m$) and the dictionary coefficient ($Z_m^{test}$) is minimized; and
determining, the dictionary coefficient ($Z_m^{test}$) for each electrical load (m) such that the total variation over the graph topology ($L_m$) is minimized.

4. The method as claimed in claim 2, wherein the solution to the optimization model is determined by taking derivative of the objective function with respect to the dictionary coefficient ($Z_m^{test}$) and equating it to zero.

5. The method as claimed in claim 1, wherein the load consumption ($\widehat{X_m}$) is estimated based on the product of estimated energy coefficient ($Z_m^{test}$) with the corresponding dictionary ($D_m$).

6. A system (102) for electrical load disaggregation, the system (102) comprising:
a memory (208) storing instructions;
one or more Input/output (I/O) interfaces (206);
and one or more hardware processors (204) coupled to the memory (208) via the one or more I/O interfaces (206), wherein the one or more hardware processors (204) are configured by the instructions to:
receive from the energy load disaggregation module (212),
an aggregated load data ($\overline{X}_{test}$), obtained from a utility meter among a plurality of utility meters at a plurality of regular time intervals, wherein the aggregated load data comprises total energy consumed by a plurality of electrical loads connected to the corresponding utility meter and base loads which are low power loads; and
a training data ($\overline{X}_{train}$), wherein the training data is generated from the plurality of utility meters;
represent, the aggregate load data ($\overline{X}_{test}$) and the training data ($\overline{X}_{train}$) as a matrix, where a column vector represents the plurality of regular time intervals covered in a predefined time period and a row vector represents a total number of predefined time periods considered; and
determine, a disaggregated energy load at low sampling rate for the aggregated load data ($\overline{X}_{test}$) of each utility meter, using an energy disaggregation technique comprising:
obtain, a total load consumption ($\overline{X}$) using the aggregated load data ($\overline{X}_{test}$) and the training data ($\overline{X}_{train}$);
construct, a laplacian graph ($L_m$) for each electrical load (m) using the total load consumption ($\overline{X}$);

formulate, an optimization model for estimating the dictionary coefficient ($Z_m^{test}$) of each electrical loads (m);

estimate, the dictionary coefficient ($Z_m^{test}$) of each electrical loads (m), using the laplacian graph ($L_m$), a dictionary ($D_m$) and a dictionary co-efficient ($Z_m^{test}$), wherein, the dictionary ($D_m$) and the dictionary co-efficient ($Z_m^{train}$) are obtained corresponding to the electrical load (m) using a pre-trained dictionary, wherein, the dictionary is pre-trained using the dictionary learning for every load specific consumption ($X_m$) corresponding to the electrical load (m);

estimate, the load consumption ($\widehat{X_m}$) for each electrical load (m) among the plurality of electrical loads (M) using the estimated energy coefficient ($Z_m^{test}$) with the corresponding dictionary ($D_m$); and iteratively, perform for each electrical load (m+1) among the plurality of electrical loads (M) to, re-compute, a new aggregated load data ($\overline{X}_{test}$) by subtracting the estimated load energy consumption ($\widehat{X_m}$) from the previous load consumption ($\overline{X}_{test}$) value; and re-compute, the new total load consumption ($\overline{X}$) by subtracting the estimated load energy consumption ($\widehat{X_m}$) and the load specific consumption ($X_m$) from the previous total load consumption ($\overline{X}$).

7. The system (102) as claimed in claim 6, wherein the one or more hardware processors (204) are configured for the optimization model to estimate the dictionary coefficient ($Z_m^{test}$) of each electrical loads (m) by constructing, a graph using the total load consumption ($\overline{X}$), considering the dictionary coefficient ($Z_m$) as graph signal.

8. The system (102) as claimed in claim 7, wherein the one or more hardware processors (204) are configured wherein the optimization model constraints includes, estimating, the dictionary coefficient ($Z_m^{test}$) using the dictionary ($D_m$) such that error between ($\overline{X}_{test}$) and the product of the dictionary ($D_m$) and the dictionary coefficient ($Z_m^{test}$)) is minimized; and determining, the dictionary coefficient ($Z_m^{test}$)) for load m such that the total variation over the graph topology ($L_m$) is minimized, in other words, the coefficients are smooth with respect to the graph.

9. The system (102) as claimed in claim 7, wherein the one or more hardware processors (204) is configured wherein the solution to the optimization model is determined by taking derivative of the objective function with respect to the dictionary coefficient ($Z_m^{test}$) and equating it to zero.

10. The system (102) as claimed in claim 6, wherein the one or more hardware processors (204) is configured wherein the load consumption ($\widehat{X_m}$) is estimated based on the product of estimated energy coefficient ($Z_m^{test}$) with the corresponding dictionary ($D_m$).

11. One or more non-transitory machine-readable information storage mediums comprising one or more instructions which when executed by one or more hardware processors perform actions comprising:

receiving, by a processor (204), an aggregated load data ($\overline{X}_{test}$), obtained from a utility meter among a plurality of utility meters at a plurality of regular time intervals, wherein the aggregated load data comprises total energy consumed by a plurality of electrical loads (m) connected to a utility meter and base loads which are low power loads; and a training data ($\overline{X}_{train}$), wherein the training data is generated from the plurality of utility meters;

representing, by the processor (204), the aggregate load data ($\overline{X}_{test}$) and the training data ($\overline{X}_{train}$) as a matrix, where a column vector represents the plurality of regular time intervals covered in a predefined time period and a row vector represents a total number of predefined time periods considered; and determining, by the processor (204), from the aggregated load data ($\overline{X}_{test}$) of the utility meter, a disaggregated energy load ($\widehat{X_m}$) at low sampling rate, using an energy disaggregation technique comprising:

obtaining, a total load consumption ($\overline{X}$) using the aggregated load data ($\overline{X}_{test}$) and the training data ($\overline{X}_{train}$);

constructing, a laplacian graph ($L_m$) for each of the plurality of electrical load (m) using the total load consumption ($\overline{X}$);

formulating, an optimization model for estimating the dictionary coefficient ($Z_m^{test}$) of each of the plurality of electrical loads (m);

estimating, the dictionary coefficient ($Z_m^{test}$) of each electrical loads (m), using the laplacian graph ($L_m$), a dictionary ($D_m$) and a dictionary co-efficient ($Z_m^{train}$), wherein, the dictionary ($D_m$) and the dictionary co-efficient ($Z_m^{train}$) are obtained for each of the electrical load (m) using a pre-trained dictionary, and wherein, the dictionary is pre-trained using the dictionary learning for each electrical load (m) load using a load specific consumption ($X_m$) corresponding to the electrical load (m);

estimating, the load consumption ($\widehat{X_m}$) for each electrical load (m) among the plurality of electrical loads (M) using the estimated energy coefficient ($Z_m^{test}$) with the corresponding dictionary ($D_m$); and iteratively, performing for each electrical load (m) among the plurality of electrical loads (M) steps of:

re-computing, a new aggregated load data ($\overline{X}_{test}$) by subtracting the estimated load energy consumption ($\widehat{X_m}$) from the previous load consumption ($\overline{X}_{test}$) value; and re-computing, the new total load consumption ($\overline{X}$) by subtracting the estimated load energy consumption ($\widehat{X_m}$) and the load specific consumption ($X_m$) from the previous total load consumption ($\overline{X}$).

12. The one or more non-transitory machine-readable information storage mediums of claim 11, wherein the optimization model for estimating the dictionary coefficient ($Z_m^{test}$) of each electrical loads (m) by, construct, a graph using the total load consumption ($\overline{X}$), considering the dictionary coefficient ($Z_m$) as the graph signal.

13. The one or more non-transitory machine-readable information storage mediums of claim 12, wherein the optimization model constraints includes, estimating, the dictionary coefficient ($Z_m^{test}$)) using the dictionary ($D_m$) such that error between ($\overline{X}_{test}$) and the product of the dictionary ($D_m$) and the dictionary coefficient ($Z_m^{test}$)) is minimized; and determining, the dictionary coefficient ($Z_m^{test}$) for each electrical load (m) such that the total variation over the graph topology ($L_m$) is minimized.

14. The one or more non-transitory machine-readable information storage mediums of claim 12, wherein the solution to the optimization model is determined by taking derivative of the objective function with respect to the dictionary coefficient ($Z_m^{test}$) and equating it to zero.

15. The one or more non-transitory machine-readable information storage mediums of claim 11, wherein the load consumption ($\widehat{X_m}$) is estimated based on the product of estimated energy coefficient ($Z_m^{test}$) with the corresponding dictionary ($D_m$).

* * * * *